United States Patent [19]
Lane

[11] Patent Number: 4,458,164
[45] Date of Patent: Jul. 3, 1984

[54] FREQUENCY TO VOLTAGE TRANSDUCER

[75] Inventor: L. Jubin Lane, Salem, Va.

[73] Assignee: General Electric Company, Salem, Va.

[21] Appl. No.: 383,076

[22] Filed: May 28, 1982

[51] Int. Cl.³ .......................... H03K 11/00; H03K 9/06
[52] U.S. Cl. ...................................... 307/519; 328/140
[58] Field of Search ................ 307/519, 520; 328/167, 328/140

[56] References Cited

U.S. PATENT DOCUMENTS

| | | | |
|---|---|---|---|
| 3,978,420 | 8/1976 | Lane | 330/107 |
| 3,997,869 | 12/1976 | Mayer | 328/140 |
| 4,243,940 | 1/1981 | Ruof | 307/519 |
| 4,289,974 | 9/1981 | Katunin et al. | 328/140 |

OTHER PUBLICATIONS

Operational Amplifier, (Library Congress Catalog No. 74-163297), McGraw Hill Book Co., pp. 400-403.

Primary Examiner—John S. Heyman
Attorney, Agent, or Firm—Arnold E. Renner

[57] ABSTRACT

A frequency to voltage transducer for producing an output signal having a value proportional to the magnitude of the frequency of an input signal includes a tunable filter circuit for simulating a resistance - inductance - capacitance (RLC) circuit with a resonant frequency approximately equal to the anticipated base frequency of the input signal. Through appropriate feedback means and multiple gain paths within the simulated RLC circuit, there is provided an output signal which is proportional in magnitude to the frequency of the input signal.

8 Claims, 3 Drawing Figures

FREQUENCY TO VOLTAGE TRANSDUCER

RELATED PATENT AND APPLICATION

This invention is related to U.S. Pat. No. 3,978,420 "Self-Tuning Filter" by L. Jubin Lane, issued Aug. 31, 1976, and to U.S. patent application Ser. No. 383,225, "Voltage Controlled Oscillator Using a Voltage Tunable Filter with Feedback" by L. Jubin Lane which was filed on even data herewith.

BACKGROUND OF THE INVENTION

The present invention relates generally to frequency transducers and more particularly to a frequency to voltage transducer for providing a voltage output signal proportional to the frequency of an input signal.

There are many instances in which it is necessary to provide a very accurate indication of the frequency of a signal. For example, in the discipline of electrical power generation, it is necessary to have an accurate indication of the frequency of the generated power so that the generating equipment can be controlled to maintain an accurate base frequency; e.g., 60 hertz (Hz). A number of systems have been devised for providing this function.

One of the more common methods of determining frequency, particularly with respect to power level signals, is to determine the times between zero crossings of the voltage signal being measured and to determine the frequency from those zero crossings. These systems can perform very well if the signal being measured is free of noise (or can be reconstructed so as to be free of noise) so that the zero crossings can be accurately determined. An example of a reconstruction technique suitable for use in the type of system just described can be found in U.S. Pat. No. 3,978,420 "Self-Tuning Filter" by L. Jubin Lane, issued Aug. 31, 1976, which patent is assigned to the assignee of the present invention and is specifically hereby incorporated hereinto by reference. This type of system is most applicable to those situations where the frequency variation is relatively large (e.g., 0 to 60 Hz) and where extreme accuracy is not required.

Such systems are not, however, particularly adapted for precise measurement centered around some critical frequency (e.g., 60±0.5 Hz) such as required in the power generation industry. In addition, such systems normally require some additional means such as counters and evaluation circuitry to develop a suitable frequency control signal.

SUMMARY OF THE INVENTION

It is, therefore, an object of the present invention to provide an improved frequency to voltage transducer.

It is a further object to provide a frequency to voltage transducer which develops large variations in its output voltage in response to small changes in frequency of the signal being measured.

It is a further object to provide a frequency to voltage transducer which may be selectably designed with respect to its base frequency and gain.

Another object is to provide a new and improved frequency to voltage transducer employing a self-tuning filter.

The foregoing and other objects are achieved in accordance with the present invention by providing a frequency to voltage transducer which provides an output voltage signal having a magnitude proportional to the frequency of the input signal. This transducer employs a tunable filter circuit which simulates a resistance-inductance-capacitance (RLC) circuit, the resonant frequency of which is adjustable in response to an applied input signal. The tunable filter circuit provides various signals representing the inductance, resistance and capacitance voltages of the simulated circuit and through the employment of multiple gain paths, including integrating means, in association with feedback means responsive to the represented voltages produces the output signal or voltage which is proportional to the frequency of the input signal.

BRIEF DESCRIPTION OF THE DRAWING

Although the novel features of the present invention are set forth in particularity in the claims annexed to and forming a part of this specification, the invention, both as to organization and content, will be better understood and appreciated along with other objects and features thereof from the following detailed description taken in conjunction with the accompanying drawings in which:

DETAILED DESCRIPTION

Figure 1:
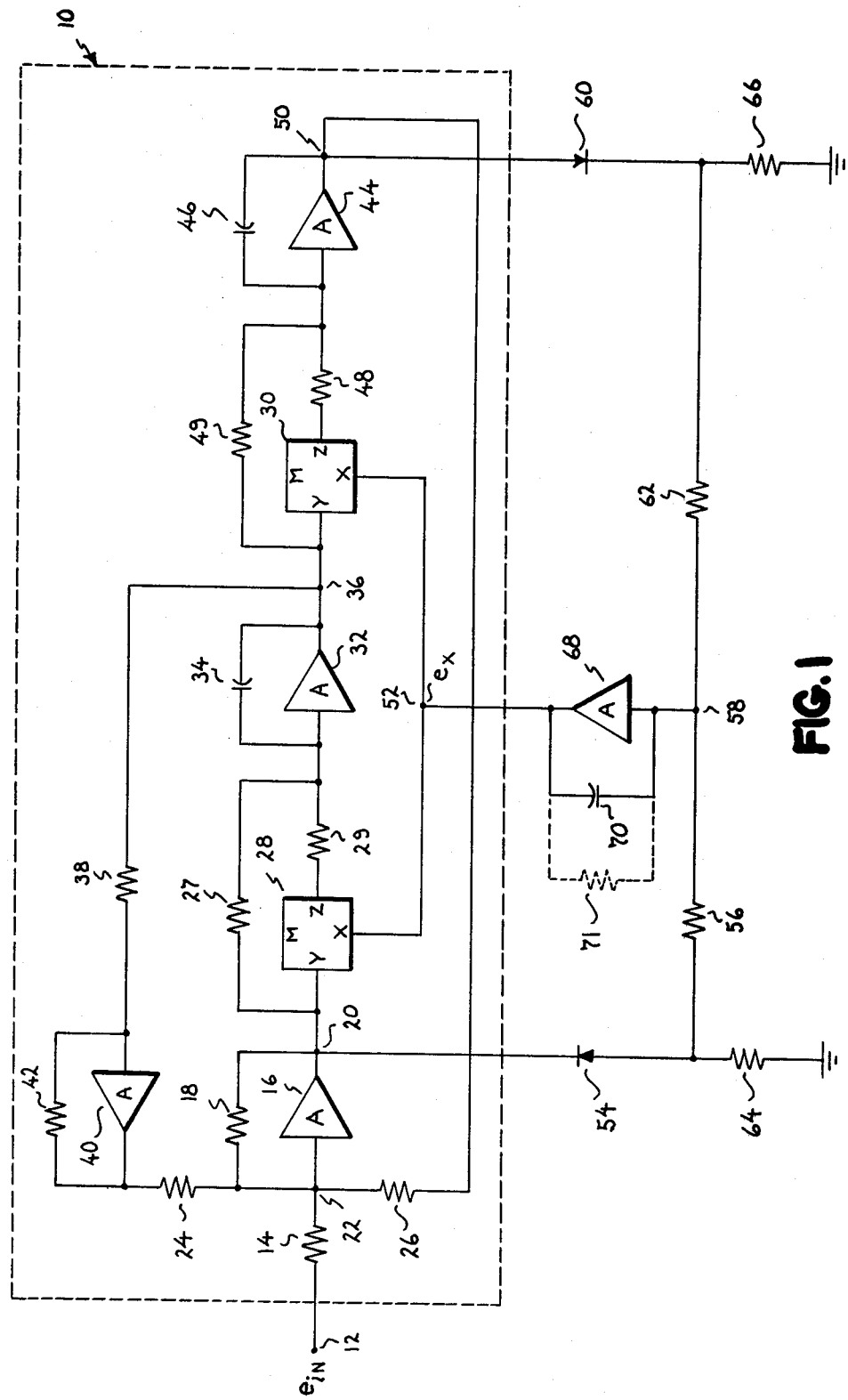
FIG. 1 is a schematic block diagram of the frequency to voltage transducer in accordance with the present invention.

Reference is now made to FIG. 1 which illustrates the frequency to voltage transducer of the present invention in its preferred embodiment. Basically, the system includes a voltage tunable filter circuit, depicted within the dashed line block 10, and a feedback portion which is the remaining portion of FIG. 1. Those familiar with the aforementioned U.S. Pat. No. 3,978,420 will recognize that there is a substantial degree of similarity between that shown in that patent and the present invention. More specifically, the distinctions lie in a modification to the self-tuning filter circuit which comprises the addition of the resistors 27 and 49 which will be further explained hereinafter and the omission of certain bias and direction circuitry from the feedback circuitry. Although similarities do exist, the operation of the circuitry here depicted and that shown in U.S. Pat. No. 3,978,420 are considerably different and provide essentially different end results. In addition, it should be noted that the depiction within block 10 is identical, at least in all material aspects to a further application of the modified self-tuning filter which is found in copending U.S. patent application Ser. No. 383,225, titled "Voltage Controlled Oscillator Using a Voltage Tunable Filter with Feedback" by the present inventor, which application was filed on even data herewith.

In FIG. 1, the filter circuit 10 is provided with an input terminal 12 for receiving an input signal from any appropriate source (not shown). Typically, the input signal, $e_{in}$, would be, basically, a sine wave which may or may not have a relatively large amount of irregularities or electrical noise superimposed thereon as is well understood in the art. In the present description, it will be assumed for purposes of illustration that the basic frequency of the input signal is 60 hertz (Hz). The input signal at terminal 12 is applied by way of an input resistor 14 to a suitable summing amplifier 16. Amplifier 16 may be a conventional operational amplifier including a feedback resistor 18 tied between its output (junction 20) and its input (junction 22). (In all cases in this specification, operational amplifiers are shown having a single input. It is to be understood that, in accordance with common practice, this input is the inverting one and the non-inverting operational amplifier input will be connected to ground through a suitable resistor.) Two additional inputs by way of resistors 24 and 26 are also supplied to the amplifier. The signals thus applied correspond, respectively, as will be more fully understood as this description proceeds, to the voltages corresponding to the resistive and capacitive components of a simple RLC circuit which is simulated by the filter circuit 10. As is known, the voltage relationships existing in simple RLC circuits can be defined by the equation:

$$V_L = e - V_R - V_C \qquad (1)$$

wherein;
 $e$ = instantaneous applied voltage
 $V_L$ = inductance voltage
 $V_R$ = resistance voltage
 $V_C$ = capacitance voltage Thus, there appears at junction 20 the output of amplifier 16, a voltage which is proportional to the inductance voltage of the simulated circuit of the filter 10.

The signal at junction 20 is applied to two separate gain paths. The signal is first applied to a Y input of a multiplier 28 which also has an X input and an output Z. Multiplying circuits such as used at 28 are known in the art and provide at the Z output terminal a signal which is a function of the product of the two inputs to the X and Y terminals. Mathematically, the relationship existing in a multiplier circuit can be represented by the formula: $Z = X \cdot Y \cdot K_1$; wherein $K_1$ is a constant determined by the multiplier used. Multiplier circuits such as shown at 28 are commercially available and one suitable circuit for employment in the present invention is sold by Analog Devices, Inc., identified as a Model 432J. The signal applied to the X input of the multiplier 28 is a control voltage which also serves as the output voltage of the present invention, the derivation and function of which will be explained hereinafter.

The output of multiplier 28 forms one input to an integrator circuit having a first input resistor 29 and an operational amplifier 32 having a capacitor 34 tied between its output and its input. A second signal is also integrated by the integrating circuit and it is seen that the signal at junction 20 is applied by a second integrator input resistor 27 to the operational amplifier 32. Thus, the output of operational amplifier 32, at junction 36, is the integral of the signals of the two gain paths as seen at junction 20. That is, it is the integral of the signal at junction 20 which is being applied by the gain path including the multiplier 28 and resistor 29 and by the gain path including resistor 27. The output of the operational amplifier 32 at junction 36 is representative of the current which exists in the modified simulated RLC circuit and, as such, will also be proportional to the resistance voltage of that simulated circuit.

The signal at junction 36, because of the inverting nature of operational amplifiers, is of the incorrect polarity for application to amplifier 16 and is, therefore, applied by way of resistor 38 to an inverting amplifier 40 having resistor 42 tied between its output and its input. The output of amplifier 40 is applied by way of the previously mentioned resistor 24 to the input of amplifier 16 and thus forms the resistive voltage component earlier described.

In a manner similar to the employment of the signal at junction 20, the signal at junction 36 also is utilized through two gain paths. The first of these gain paths is through multiplier 30, which may be identical to multiplier 28, and the signal at junction 36 constitutes the Y input thereto. The signal applied to the X input of multiplier 30 is the same as that applied to the X input of multiplier 28, that is, the control voltage or output voltage of the present invention. The output of multiplier 30 is applied to a second integrator including a first input resistor 48 and an operational amplifier 44 having capacitor 46 tied between its input and its output. The signal at junction 36 is also applied by way of resistor 49 to the input of amplifier 44 such that the output of that amplifier (at junction 50) is the integral of the signal at junction 36 as modified by the two gain paths just described.

The signal at junction 50 represents the capacitance voltage of the simulated RLC circuit and this signal is delivered to the input junction 22 of amplifier 16 via resistor 26. Thus, it is seen that at the output of amplifier 16, the voltage is proportional to the simulated inductance voltage since its three inputs are proportional to the three components described and identified by the formula (1) above, i.e., the input voltage, the resistance voltage and the capacitance voltage by some factor determined by the various gains of the several paths.

In several instances, mention has been made of the control voltage which varies the resonant frequency of the voltage tunable filter and which also serves as the output of the present invention. This is the voltage, as previously described, which is applied to the X terminals of each of the multipliers 28 and 30 from junction 52. In FIG. 1 this signal is given the additional designation $e_x$. The generation of this control/output voltage is as follows. The signal appearing at junction 20, representing the simulated scaled inductance voltage, is applied by way of a diode 54 and a resistor 56 to a junction 58. Diode 54 is poled so as to conduct only negative signals from the junction 20 to the junction 58. The signal at junction 50, the simulated capacitance voltage, is applied by way of a diode 60 and a resistor 62 to the junction 58. Diode 60 is poled to conduct only positive signals to that junction. Two additional resistors 64 and 66 are connected respectively between the anode of diode 54 and the cathode of diode 60 and ground. The resistors 64 and 66 are nothing more than leakage resistors. They take any leakage current through the diodes to ground and prevent them from affecting the operation of the system. If diodes 54 and 60 were perfect, these resistors would be unnecessary and they are included here only for purposes of accuracy and illustration.

The signal appearing at junction 58 is applied to an operational amplifier 68 having a capacitor 70 connected between its output and its input. A resistor 71, showing in phantom, may be connected in parallel with capacitor 70. In a larger sense, resistors 56 and 62, amplifier 68, capacitor 70 and resistor 71 form a low pass filter circuit for the development of the output voltage and for the control voltage which appears at junction 52 and as applied to the X inputs of the two multipliers 28 and 30. In the preferred embodiment, the special case of the low pass filter commonly referred to as an integrator, the cut-off frequency of the low pass filter circuit is moved from some finite positive value to zero. Therefore, in the preferred embodiment, resistor 71 is not present (or, viewed in another way, resistance of 71 is then infinite), and a composite signal of the simulated inductance and capacitance voltages as exists at junction 58 is integrated and this integrated signal is applied to junction 52 where it is utilized as the output signal and as the input to the two multipliers as earlier described.

Having described the circuitry as shown in FIG. 1, the explanation of its operation is substantially as follows. In the following explanation, the letter R with a subscript will denote the resistive value of a resistor. That is, $R_{27}$ denotes the resistive value of the resistor 27. In a similar manner, a C with a subscript denotes the capacitance of a particular capacitor while the letter M with a subscript denotes the multiplication constant of a multiplier; for example, $M_{28}$ is the multiplication constant of the multiplier 28.

The special case use of the circuitry shown in FIG. 1 in accordance with the preferred embodiment of the present invention requires, for linearity, that certain relationships be established. These are, essentially:

$R_{27} = R_{49}$ $R_{29} = R_{48}$ $C_{34} = C_{46}$ $R_{26} = R_{18}$ $M_{28} = M_{30} = M$

It should be remembered that the center frequency of the pass band, that is the resonant frequency of the filter circuit within the dashed line block 10, is tunable by means of the signal $e_x$ at junction 52. From the foregoing, it can be determined that the output frequency, $$\omega_o = \frac{M}{R_{29} C_{34}} e_x + \frac{1}{R_{27} C_{34}} \quad (2)$$

It is readily apparent that equation (2) represents a straight line characteristic in the relationship between the input frequency and the output voltage $e_x$. In this relationship, the entire circuit of FIG. 1 comprises a self-tuning filter and when $e_{in}$ is a periodic signal whose wave form is compatible with the characteristics of this filter, the filter will tune itself to the fundamental frequency component of $e_{in}$, in the present example 60 Hz. When the tuning process is complete and the system is operating in a steady state, $\omega_o = \omega_f$, wherein $\omega_o$ is the resonant or output frequency of the filter and $\omega_f$ is the fundamental frequency of the input signal $e_{in}$. Therefore, $\omega_f$ can be substituted for $\omega_o$ in equation (2). Solving equation (2) for $e_x$ gives:

$$e_x = \frac{R_{29} C_{34}}{M} \cdot \omega_f - \frac{R_{29}}{R_{27}M} \quad (3)$$

This expression makes it apparent that the circuit of FIG. 1, including the resistors 27 and 49, employed as the second gain path for the respective signals at junctions 20 and 36 makes this circuit useable as a frequency to voltage transducer. In equation 3, the constant in the first term, that is, ($R_{29} C_{34}/M$) denotes the slope of the linear relationship between input frequency and output voltage $e_x$ while the term ($R_{29}/R_{27}M$) determines the frequency offset. These are demonstrated in FIG. 2.

Figure 2:
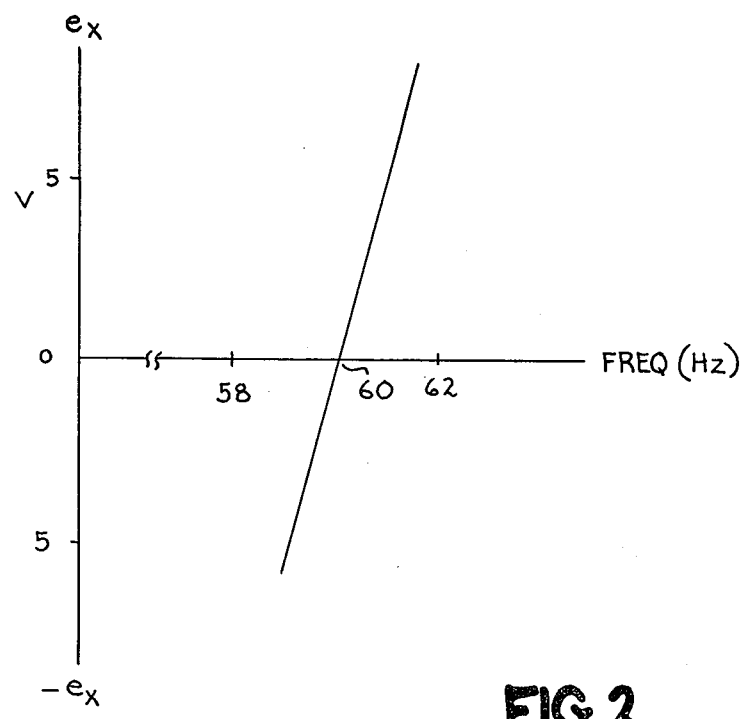
FIG. 2 is a graph representing the relationship between the output voltage and input frequency of the transducer in accordance with the present invention; and, FIG. 3 is a graphical representation of the relationship between output voltage and input frequency of the self-tuning filter upon which the present invention is based.
Figure 3:
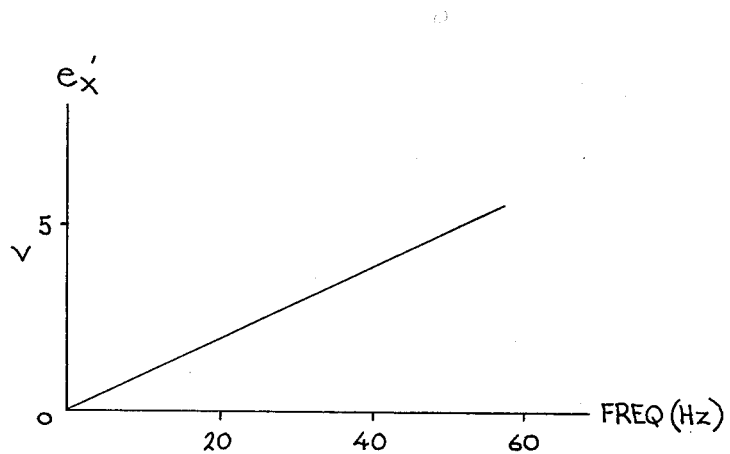

Before referencing FIG. 2, it is first believed advantageous to review briefly FIG. 3 which shows a similar relationship with the circuit shown in U.S. Pat. No. 3,978,420. It is seen that this patent also will provide at its corresponding terminal 52 a linear relationship between that voltage and the input frequency. This relationship will go from zero to some finite value in a linear relationship as indicated. FIG. 2 when compared to FIG. 3 graphically demonstrates the differences between the circuitry of that patent and its operation and these of the present invention. The voltage in FIG. 3 is shown as the ordinate while the frequency is indicated on a greatly enlarged scale as compared to FIG. 3. It is seen that the slope, by comparison, is much steeper and thus as previously indicated will provide a large variation in output voltage in accordance with small variations in the frequency. As indicated, the first term of equation (3) will determine the slope of the linear relationship while the offset is determined by the second term of that equation. In this particular example, the offset from zero is shown to be approximately sixty hertz. Thus, according to the depiction in FIG. 2 when the input frequency of the signal at terminal 12 is exactly at 60 hertz, the output voltage will be zero. If the frequency falls slightly below sixty hertz, the relatively large negative voltage $e_x$ will be present while if the frequency exceeds 60 hertz, the output voltage $e_x$ will rapidly rise in a linear manner.

From a comparison of the depictions of FIG. 2 and FIG. 3, the advantages of the present invention as a frequency to voltage transducer are apparent. The voltage values shown in FIGS. 2 and 3 are merely for representative and illustrative purposes, and, of course, could be adjustable; however, their dependent relationship is substantially as indicated.

Thus, it is seen that it has been provided a voltage to frequency transducer which is self-tuning and which provides relatively large voltage excursions for relatively small changes in input signal frequency and thus readily adapts itself to its intended purpose. In addition, other outputs such as those at junctions 20, 36 and 50 can be used as indications of the various simulated RLC circuit voltages in accordance with the teachings of aforementioned U.S. Pat. No. 3,978,420.

While there has been shown and described what is at present considered to be the preferred embodiment of the invention, modifications thereto will readily occur to those skilled in the art. For example, the quantity relationships set forth between the various resistors, capacitors and multiplication constants are, in the preferred embodiment of the invention, desirable from the standpoint of providing a linear relationship between the input frequency and the output voltage. While this is a very desirable feature, it is recognized that it is not an absolute necessity and that some variation in these values is permissible if other than a linear relationship is permissible, or in fact desired for some reason. It is also noted that while, in the preferred embodiment the outputs of the two gain paths are in each case added and the sum integrated, an equal result could be achieved by other methods such as integrating in each path and then summing the two integrated values. It is not desired, therefore, that the invention be limited to the specific arrangement shown and described and it is intended to cover in the appended claims all such modifications as fall within the true spirit and scope of the invention.

What is claimed is:

1. A frequency to voltage transducer for producing an output voltage signal having a magnitude proportional to the frequency of an input signal comprising:
   (a) a tunable filter circuit for simulating a resistance-inductance-capacitance circuit having a resonant frequency which is adjustable in response to said output voltage signal, said filter circuit comprising,
      (1) circuit means for providing at its output a first signal representative of the voltage of the inductance of the simulated circuit in response to said input signal, a signal representing the capacitance voltage and a signal representing the resistance voltage,
      (2) a first gain path including first multiplier means responsive to said first signal and said output voltage signal to provide a signal proportional to the product of thereof,
      (3) a second gain path for providing an output signal proportional to said first signal,
      (4) first integrating means responsive to the output signals of said first and second gain paths to develop a signal proportional to the resistance voltage of the simulated circuit,
      (5) third gain path means including second multiplying means responsive to said signal proportional to the resistance voltage and said output voltage signal to provide an output signal,
      (6) fourth gain path means for providing an output signal proportional to said signal proportional to the resistance voltage; and,
      (7) second integrating means responsive to the output signals of said third and fourth gain paths to develop a signal proportional to the capacitance voltage of said simulated circuit; and,
   (b) feedback means responsive to said signals representing the inductance voltage and the capacitance voltage to provide said output voltage signal proportional to the frequency of said input signal.

2. The invention in accordance with claim 1 wherein said first and third gain paths have substantially equal gain constants and said second and fourth gain paths have substantially equal gain constants.

3. The invention in accordance with claim 1 or 2 wherein each of said second and fourth gain paths comprises resistance means.

4. The invention in accordance with claim 1 or 2 wherein said feedback means comprises a low pass filter means including means for combining the signals representing the inductance and capacitance voltages in a differencing mode to provide a difference signal and means responsive to the difference signal to provide said output voltage signal.

5. The invention in accordance with claim 1 wherein said feedback means comprises a low pass filter circuit including means for combining the signals representing the inductance voltage and the capacitance voltage to provide a difference signal having a value proportional to the difference in magnitude between the inductance voltage and the capacitance voltage signals and means responsive to said difference signal to generate said output voltage signal, whereby the resonant frequency of said filter circuit is varied to match the frequency of said input signal.

6. The invention in accordance with claim 5 wherein said feedback means further includes two feedback paths for conducting, respectively, the signals representing the inductance and capacitance voltages and wherein each of said paths includes a diode, the diode of the first of said paths being poled to conduct a signal of a first relative polarity and the diode of the second of said paths poled to conduct a signal of the opposite relatively polarity.

7. The invention in accordance with claim 6 wherein the diode connected to conduct the signal representing the inductance voltage is poled to conduct a relatively negative voltage.

8. The invention in accordance with claim 5 wherein said low pass filter circuit is an integrator to thereby perform an integration function on said difference signal.

* * * * *